(12) United States Patent
Feldman et al.

(10) Patent No.: US 6,788,103 B1
(45) Date of Patent: Sep. 7, 2004

(54) ACTIV SHUNT-PEAKED LOGIC GATES

(75) Inventors: Arnold R. Feldman, San Francisco, CA (US); Marc J. Loinaz, Palo Alto, CA (US)

(73) Assignee: Aeluros, Inc., Mountain View, CA (US)

( * ) Notice: Subject to any disclaimer, the term of this patent is extended or adjusted under 35 U.S.C. 154(b) by 0 days.

(21) Appl. No.: 10/213,484

(22) Filed: Aug. 6, 2002

(51) Int. Cl.[7] ............................................. H03K 17/16
(52) U.S. Cl. ............................ 326/34; 326/83; 326/121
(58) Field of Search ............................ 326/26, 27, 31, 326/34, 83, 86, 112, 1, 119, 121, 115, 126, 127

(56) References Cited

U.S. PATENT DOCUMENTS 5,043,602 A * 8/1991 Flannagan .................. 326/126
6,366,140 B1 * 4/2002 Warwar ...................... 327/108

OTHER PUBLICATIONS

M.M. Green, et al., OC–192 Transmitter in Standard 0.18μm CMOS, 2002.
J. Choma, Jr., "Actively Peaked Broadbanded Monolithic Amplifier," Proceedings of the IEE, vol. 127, Part G, Apr. 1980, pp. 61–66.
E. Säckinger and W. Fischer, "A 3 GHz CMOS Limiting Amplifier for SONET OC–48 Receivers", IEEE Journal of Solid–State Circuits, vol. 35, No. 12, Dec. 2000, pp. 1884–1888.

T. Lee, The Design of CMOS Radio Frequency Circuits, Cambridge University Press, High Frequency Amplifier Design, 1998, pp. 178–184.

* cited by examiner

*Primary Examiner*—Don Le
(74) *Attorney, Agent, or Firm*—Stattler Johansen & Adeli LLP

(57) ABSTRACT

A logic circuit employs a shunt peaked technique to enhance the switching speed of the circuit without an increase in power dissipation. A differential logic gate implements a digital circuit function. The shunt peaked logic circuit includes two resistive and two inductive elements. For each differential output line, a resistive element is coupled in series to an inductive element so as to couple the circuit power supply voltage to a differential output line. Under this configuration, the bandwidth of the logic circuit is increased without an increase in power consumption. The logic circuit may be implemented using CML or ECL logic.

29 Claims, 5 Drawing Sheets

ACTIV SHUNT-PEAKED LOGIC GATES

BACKGROUND OF THE INVENTION

1. Field of the Invention

The present invention is directed toward the field of logic gates, and more particularly toward high-speed logic gates.

2. Art Background

Data communication systems transport data at a speed defined by a predetermined data rate. The speed of transmitting data in modem broadband communication systems has rapidly increased in recent years. Today, data rates as high as 40 giga bits per second ("Gbps") are required for the OC-768 optical networking standard.

These data communication systems include basic digital circuits, such as multiplexors, demultiplexors, and constituent logic gates. Thus, to operate at high data rates, the digital circuits must also switch at high speeds (i.e., the digital circuits require a high bandwidth of operation). In addition to operating at high speeds, the digital circuits must be designed to minimize power dissipation. Excessive power dissipation degrades integrated circuit performance by producing excessive heat.

Typically, high-speed logic circuits are designed based on bipolar emitter-coupled logic ("ECL") or metal oxide semiconductor ("MOS") current-mode logic ("CML"). These logic families operate using differential inputs, clocks and outputs. FIG. 1 illustrates the conventional implementation of a current mode logic latch.

The digital logic circuits must be able to regenerate signals, so that multiple stages of digital circuits may be cascaded. As shown in FIG. 1, the CML latch circuit includes gain resistors $RL_1$ and $RL_2$. To this end, gain resistors are used on digital logic circuits (e.g., ECL and CML) to maintain a direct current ("DC") voltage swing on the drain of transistors 103, 104, 105, and 106.

One objective in designing high-speed logic circuits is to reduce the resistive-capacitive ("RC") time constant at the output of the logic gate. The RC time constant is a product of the resistance, provided by the gain resistors, and the total capacitance at the output of the logic gate. A large RC time constant results in relatively slow rise times of the output signal voltage. In turn, the slow rise time limits the operating speed of the circuit. Thus, the time constant at the output of the logic gate dictates how fast the logic circuit may operate.

One technique for reducing the time constant in the output of the digital circuits is to reduce the gain resistors (e.g., $R_{L1}$ and $R_{L2}$ for the latch of FIG. 1). However, if smaller gain resistors are used, the current flowing in the device must be increased in order to maintain the requisite voltage swing at the output of the gate. Thus, in order to attain the necessary increase in current, an increase in the device size is required. These larger device sizes, in turn, increase the load capacitance (input capacitance of a subsequent gate as well as drain capacitance internal to the gate), and therefore there is no enhanced speed performance of the gate.

Accordingly, it is desirable to provide digital logic circuits that maintain adequate output drive while switching at very high data rates. It is also desirable to provide digital logic circuits with increased performance that minimize power dissipation and device size.

SUMMARY OF THE INVENTION

A logic circuit employs a shunt peaked technique to enhance the switching speed of the circuit without an increase in power dissipation. A logic gate implements a digital circuit function. For example, the logic gate may comprise a latch or a multiplexor. In one embodiment, the logic circuit is a differential logic circuit. For this embodiment, the logic gate comprises differential inputs lines, a differential clock, and differential output lines. The shunt peaked logic circuit includes two resistive and two inductive elements. Specifically, for each differential output line, a resistive element is coupled in series to an inductive element so as to couple the circuit power supply voltage to the differential output line. Under this configuration, the bandwidth of the logic circuit is increased without an increase in power consumption.

The logic circuit may be implemented using CML or ECL logic. In one embodiment, for the CML implementation, the inductor elements comprise MOS transistors. The gates of the MOS transistors are coupled to one of the resistive elements, and the drains of the MOS transistors are coupled to a power supply voltage. The sources of the MOS transistors are coupled to the differential output lines. In addition, the resistive elements are coupled to a biasing voltage. In another embodiment, for the ECL implementation, the inductor elements comprise bipolar transistors. The bases of the bipolar transistors are coupled to the resistive elements, and the collectors of the bipolar transistors are coupled to a power supply voltage. The emitters of the bipolar transistors are coupled to the differential output lines. Each of the resistive elements is also coupled to a biasing voltage.

DETAILED DESCRIPTION

One approach to improve operating bandwidth is known as shunt peaking. In general, with shunt peaking, series inductance is introduced in the path of gain resistors to partially compensate for the load capacitance. This technique results in a bandwidth enhancement of a circuit up to 1.85 times over a circuit that does not tune out the load capacitance. The active shunt peak configuration has only been applied to wideband amplifiers. The present invention uses shunt peaking to improve the speed of high-speed logic gates, such as ECL and CML logic gates. The shunt peaked logic gate switches at very high data rates while maintaining adequate output drive. The shunt peaked logic gate also minimizes power dissipation and device size without performance degradation.

Figure 1:
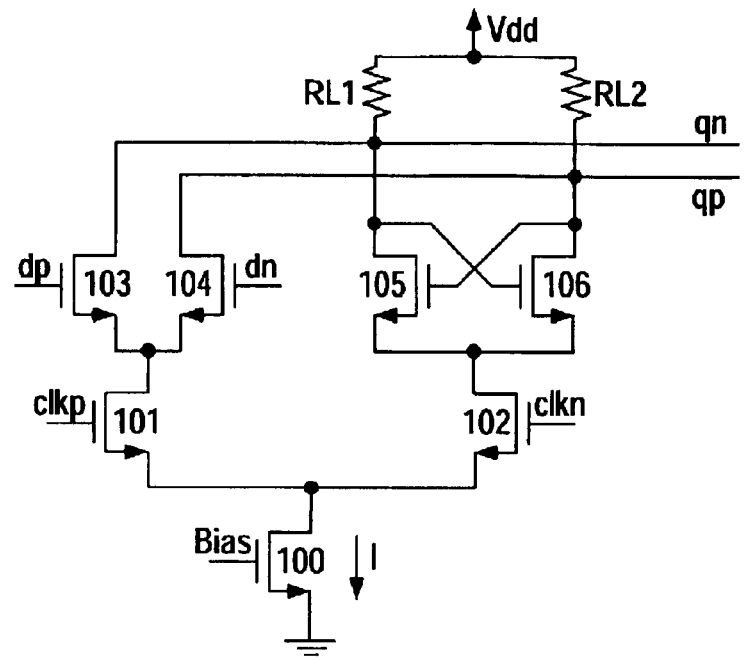
FIG. 1 illustrates the conventional implementation of a current mode logic latch.
Figure 2:
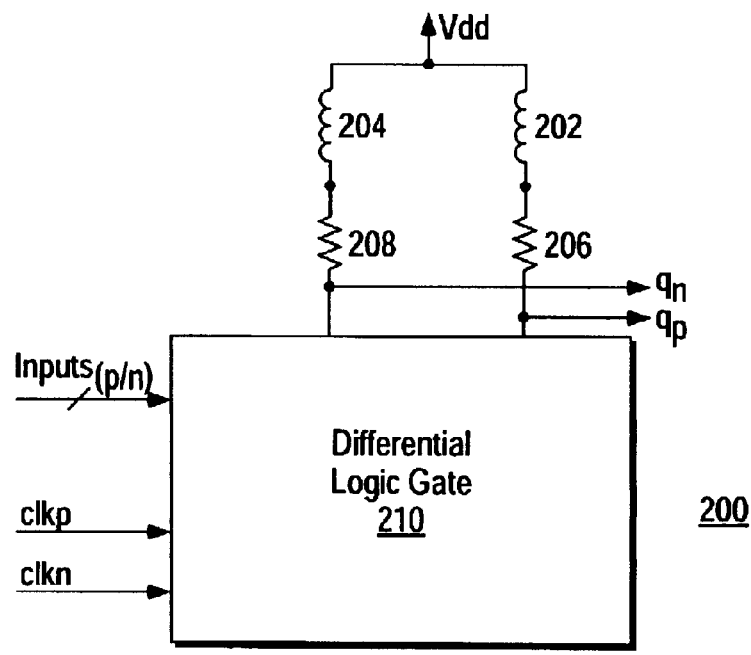
FIG. 2 is a block diagram illustrating the use of a series inductor to tune out the load capacitance of a high-speed logic gate.

FIG. 2 is a block diagram illustrating the use of a series inductor to tune out the load capacitance of a high-speed logic gate. A differential logic gate 210 performs a digital logic function. Differential logic gate 210 may perform any number of know logic functions implemented for a variety of logic families. In one embodiment, logic gate 210 comprises bipolar transistors configured using emitter-coupled logic. In another embodiment, the logic gate 210 comprises MOS transistors configured using current-mode logic. Although the present invention is described for logic gates using ECL or CML logic, any differential logic may be implemented using the techniques of the present invention. As shown in FIG. 2, differential logic gate 210 receives a plurality of differential inputs (p and n) as well as differential clocks, $clk_p$ and $clk_n$. Differential logic gate 210 generates at least one differential output, shown as $q_n$ and $q_p$ on FIG. 2.

For this embodiment, the shunt peaking technique is illustrated through use of inductors 202 and 204. Although FIG. 2 illustrates adding a physical inductor in shunt with the load capacitance at the output of the logic gate, any means for generating inductance may be used without deviating from the spirit or scope of the invention. As shown in FIG. 2, the inductors (202 and 204) are placed in series with the load resistors. Without the series inductance, the bandwidth, and therefore the switching speed of the logic gate, is inversely related to the RC product at the output of the logic gate. The addition of the inductor increases the bandwidth and therefore switching speed of the logic gate by counteracting the decrease in impedance with frequency of the load capacitance. Typically, discrete inductors are physically large. Integrated circuits utilize dense circuit implementations. Thus, the use of discrete inductors is rendered impractical when implementing logic circuits on chips. To minimize die area, the series inductance may be implemented with an active device.

Figure 3:
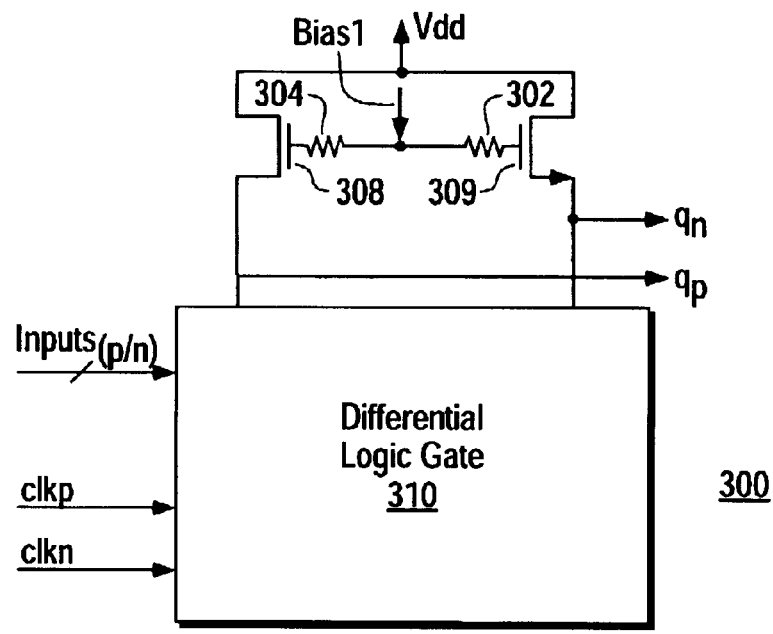
FIG. 3 illustrates one embodiment for introducing series inductance in a high-speed differential logic gate.

In another embodiment, the series inductor may be implemented using a MOS transistor. FIG. 3 illustrates one embodiment for introducing series inductance in a high-speed logic gate. As shown in FIG. 3, resistors (302 and 304) are coupled in parallel to voltage Bias1. In turn, the resistors (302 and 304) are coupled to gates of MOS transistors, 308 and 309. The drains of MOS transistors 308 and 309 are coupled to the power supply voltage, and the source of MOS transistors 308 and 309 are coupled to the output lines. The resistors (302 and 304) and MOS transistors (308 and 309) of the circuit of FIG. 3 provide an active inductance with a value directly proportional to the value of the resistors (302 and 304).

The differential logic gate 310 is biased with constant current. Also, a bias, labeled $Bias_1$ on FIG. 3, is used to set the DC voltage at the gates of MOS transistors 308 and 309 at a threshold voltage above the power supply voltage, $V_{dd}$. In one embodiment, the biasing for the CMOS implementation is accomplished with a modem process that utilizes two voltages: a standard lower voltage, $V_{dd}$, used to power the core of an integrated circuit, and a higher voltage used to power the I/O circuits. The impedance, which may be calculated by conducting a small signal analysis of the circuit of FIG. 3, is equivalent to the impedance of an inductor.

Figure 4:
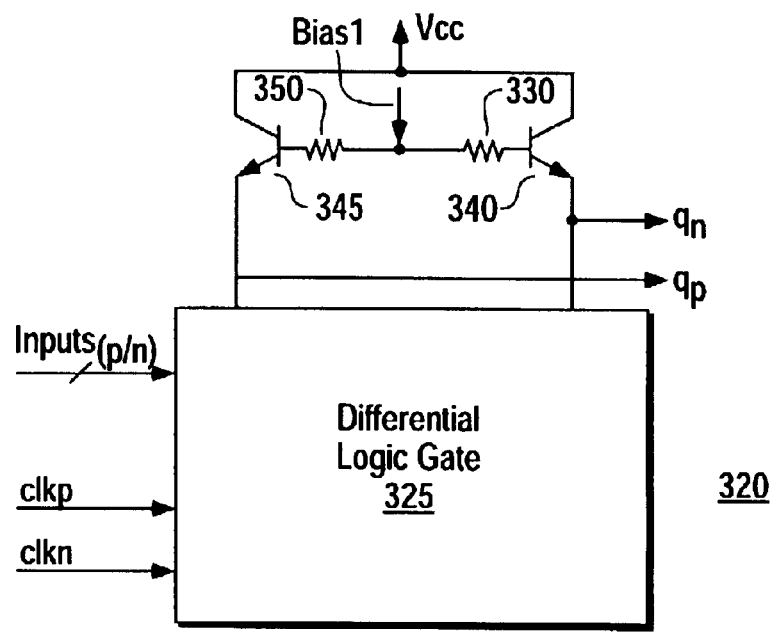
FIG. 4 illustrates a second embodiment for introducing series inductance in a high-speed differential logic gate.

FIG. 4 illustrates a second embodiment for introducing series inductance in a high-speed differential logic gate. For this embodiment, the active devices comprise npn bipolar transistors (340 and 345). As shown in FIG. 4, the resistors (330 and 350) are coupled to the base of npn transistors (340 and 345), respectively.

Figure 5:
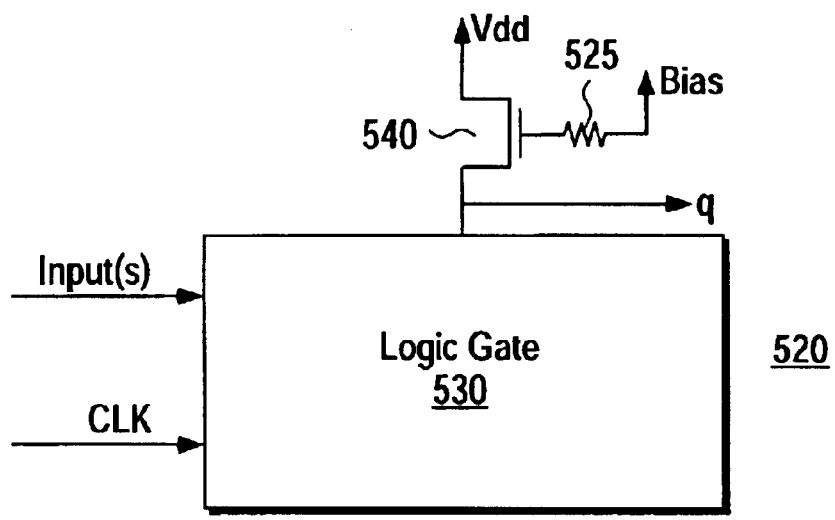
FIG. 5 illustrates one embodiment for introducing series inductance in a high-speed logic gate.

The shunt peaking technique of the present invention may also be implemented in single ended logic gates. FIG. 5 is a block diagram illustrating one embodiment for an active shunt peaking logic gate. For this embodiment, a logic gate 530, a single ended logic gate, receives at least one data input and a clock, and generates at least one output, q. Logic gate 530 may be configured to implement any well-known logic function, such as a latch or a MUX. Also, logic gate 530 may be configured using any logic family, such as CMOS. As shown in FIG. 5, the drain of MOS transistor 540 is coupled to the power supply voltage, $V_{dd}$, and the source of MOS transistor 540 is coupled to the logic gate 530 and the output, q. A resistor 525, coupled to the gate of MOS transistor 540, receives a bias voltage as shown in FIG. 5.

Figure 6:
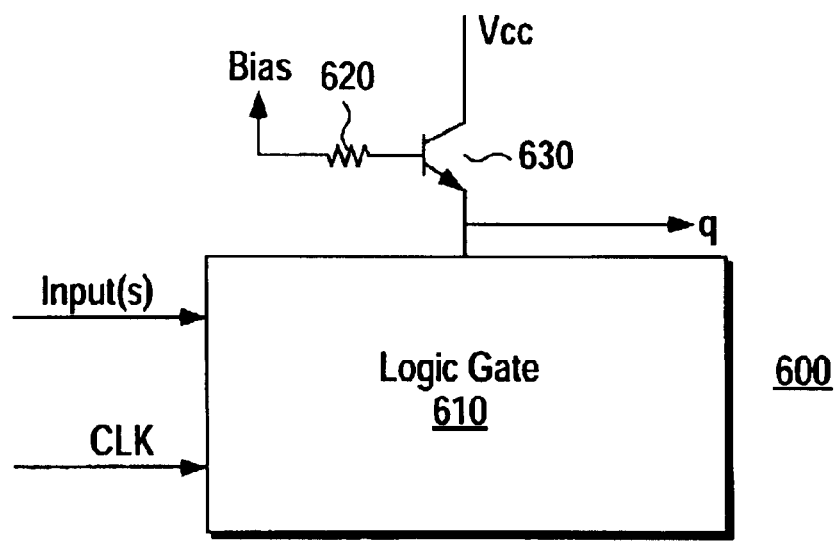
FIG. 6 illustrates a second embodiment for introducing series inductance in a high-speed logic gate.

FIG. 6 is a block diagram illustrating another embodiment for an active shunt peaking logic gate. As shown in FIG. 6, npn transistor 630 and resistor 620 are coupled to a logic gate 610. Specifically, the collector of transistor 630 is coupled to the power supply voltage, $V_{cc}$, the emitter of transistor 630 is coupled to the logic gate 610 and the output, q, and the base of transistor 630 is coupled to the resistor 620. The resistor 620 is coupled to a biasing voltage, Bias. Similar to logic gate 530, logic gate 610 may be configured to implement any well-known logic function.

In one embodiment, the differential logic gate (e.g., 210, 310 and 325) and logic gate (e.g., 530 and 610) comprise a multi-stage logic gate. As used herein, a multi-stage logic gate connotes a gate that propagates an input signal through multiple circuits to implement multiple functions, or sub-functions, within a logic circuit. For example, a latch, which comprises both a set-up and hold function, constitutes a multi-stage logic circuit (e.g., the latch includes both a set-up circuit and a hold circuit). The multiple circuits of a multi-stage logic gate may include combinational or sequential logic circuits. In other embodiments, the differential logic gate (e.g., 210, 310 and 325) and logic gate (e.g., 530 and 610) comprise a single stage logic gate. For example, a single stage logic circuit may comprise an inverter, AND gate, OR gate, NOR gate, etc.

Figure 7:
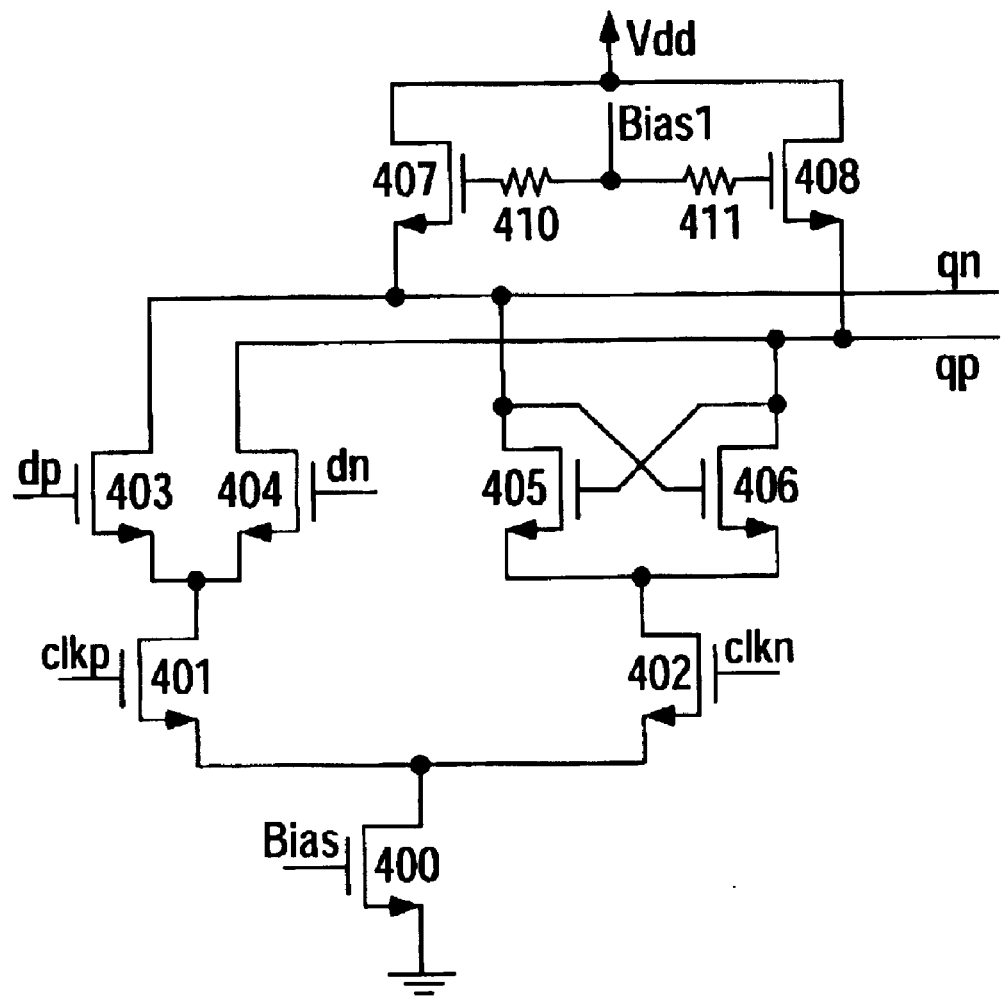
FIG. 7 illustrates one embodiment for use of the active shunt peak configuration for logic gates a latch.

FIG. 7 illustrates one embodiment for use of the active shunt peak configuration for logic gates. Specifically, FIG. 7 illustrates an example CML latch using an active shunt peaked load. In general, the active shunt peaked load enhances the bandwidth of the CML latch by increasing the operating frequency for the logic gate (e.g., ECL logic gates, CML logic gates, etc.). As shown in FIG. 7, the active shunt peaked load (resistors 410 and 411 and transistors 407 and 408) are coupled to the output lines of the latch, $q_n$ and $q_p$.

As shown in FIG. 7, the latch includes a cross-coupled transistor pair 405 and 406. The sources of the cross-coupled transistor pair (405 and 406) are coupled to the drain of MOS transistor 402. One of the differential clocks, $clk_n$, is input to the gate of transistor 402. Also, the drain of transistor 400 is coupled to the source of transistor 402. Differential inputs, $d_p$ and $d_n$, are input to the gates of MOS transistors 403 and 404, respectively. The drains of transistors 403 and 404 are coupled to the differential outputs of the latch, $q_n$ and $q_p$. The source of transistors 403 and 404 are coupled to the drain of transistor 401. Transistor 401 receives, at its gate, one of the differential clock signals, $clk_p$. The source of transistor 401 is coupled to the source of transistor 402 and to the drain of transistor 400. Transistor 400 is biased with a constant current source, "bias", as shown in FIG. 7.

When differential clock $clk_p$ is in a high logic level, and $clk_n$ clock signal is in a low logic level, the cross coupled transistor pair, 405 and 406, do not latch the input data ($d_p$ and $d_n$), and thus the differential inputs $d_p$ and $d_n$ are propagated directly to the outputs of the latch, $q_p$ and $q_n$. Alternatively, when clock signal $clk_n$ attains a high logic level and clock signal $clk_p$ attains a low logic, the latch (cross coupled transistors 405 and 406) holds the previous values presented on the differential output, $q_p$ and $q_n$.

During operation of the logic gate, the resistors (410 and 411) allow the gates of transistors 407 and 408 to move higher or lower through a transient coupling of the gate to source capacitance (i.e., a greater gate to source voltage is generated). A greater gate to source voltage causes an increase of current flow through the device. Also, a large voltage swing at the gates of transistors 407 and 408 results in faster switching of the transistors, similar to the properties exhibited by an inductor.

In the prior art, process variations in implementing the gain resistors in logic gates result in variations of the switching speed of the logic gates. The active shunt peaked logic gates of the present invention eliminate large amounts of process variations because the gain of the logic gates is based on a ratio of transistor sizes. Thus, the switching speed of the shunt peaked logic gate is insensitive to process variations from lot to lot.

The shunt peaked logic gate, unlike the prior art differential logic gates, decouples the relationship among the bandwidth of the logic gate, the DC gain of the logic gate, and the signal swing present at the output of the logic gate. The bandwidth of the shunt peaked logic gate is enhanced by increasing the size of the resistors. Although the resistors are increased, there is no impact on the DC performance of the logic gate. As a result, the bias current set in the logic gate may be based solely on the desired DC considerations of the gate. In turn, this independence allows for reduced power dissipation in the logic gate. The RC time constant, measured from the output of the logic gate, is now completely decoupled from the output voltage swing. This further permits design freedom to select device sizes without the requirement that the devices conduct additional current. Typically, a trade-off for increased bandwidth is increased power. The active shunt peaked logic gate of the present invention does not couple increased power with increased bandwidth.

Figure 8:
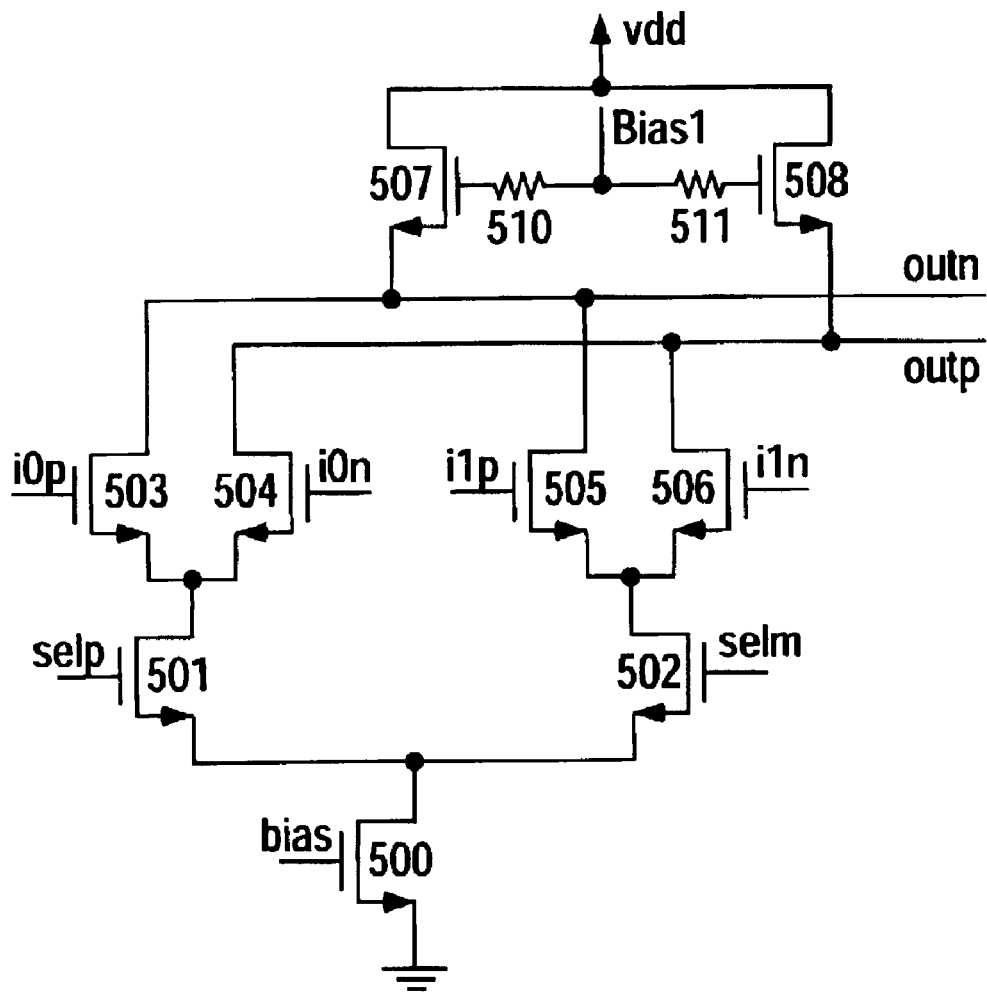
FIG. 8 illustrates another embodiment of a logic gate that implements the shunt peaked technique of the present invention.

FIG. 8 illustrates another embodiment of a logic gate that implements the shunt peaked technique of the present invention. For this embodiment, a two-to-one multiplexor is shown. The multiplexor includes resistors (510 and 511) coupled to the gates of transistors 507 and 508, respectively. Similarly, the source of MOS transistors 507 and 508 are coupled to the differential output lines, $q_n$ and $q_p$.

Although the present invention has been described in terms of specific exemplary embodiments, it will be appreciated that various modifications and alterations might be made by those skilled in the art without departing from the spirit and scope of the invention.

What is claimed is:

1. A circuit comprising:
   at least one logic gate comprising at least two differential inputs lines and at least two differential output lines;
   at least two resistive elements coupled to a biasing voltage; and
   at least two transistors, each one of said transistors is coupled in series to one of said resistive elements so as to provide an inductance between said differential output lines and said resistive elements.

2. The circuit as set forth in claim 1, wherein said logic gate comprises metal oxide semiconductor (MOS) transistors configured using current-mode logic.

3. The circuit as set forth in claim 1, wherein said transistors comprise MOS transistors, wherein a gate of each of said MOS transistors is coupled to one of said resistive elements, a drain of each of said MOS transistors is coupled to a power supply voltage, a source of said MOS transistors is coupled to said differential output lines.

4. The circuit as set forth in claim 1, wherein said logic gate comprises bipolar transistors configured using emitter-coupled logic.

5. The circuit as set forth in claim 4, wherein said transistors comprise bipolar transistors, wherein a base of each of said bipolar transistors is coupled to one of said resistive elements, a collector of each of said bipolar transistors is coupled to a power supply voltage, an emitter of said bipolar transistors is coupled to said differential output lines.

6. The circuit as set forth in claim 1, wherein said logic gate comprises a latch.

7. The circuit as set forth in claim 1, wherein said logic gate comprises a multiplexor.

8. A method for high-speed switching of a logic gate, said method comprising the steps of:
   providing at least one logic gate comprising at least two inputs lines and at least two differential output lines;
   coupling a first resistive element to a biasing voltage;
   coupling said first resistive element in series to a first transistor such that said first transistor provides an inductance between a first differential output line of said logic gate and said first resistive element;
   coupling a second resistive element to a biasing voltage; and
   coupling said second resistive element in series to a second transistor such that said second transistor provides an inductance between a second differential output line of said logic gate and said second resistive element.

9. The method as set forth in claim 8, wherein said logic gate comprises metal oxide semiconductor (MOS) transistors configured using current-mode logic.

10. The method as set forth in claim 9, wherein said transistors comprise MOS transistors, wherein a gate of each of said MOS transistors is coupled to one of said resistive elements, a drain of each of said MOS transistors is coupled to a power supply voltage, a source of said MOS transistors is coupled to said differential output lines.

11. The method as set forth in claim 8, wherein said logic gate comprises bipolar transistors configured using emitter-coupled logic.

12. The method as set forth in claim 11, wherein said transistors comprise bipolar transistors, wherein a base of each of said bipolar transistors is coupled to one of said resistive elements, a collector of each of said bipolar transistors is coupled to a power supply voltage, an emitter of said bipolar transistors is coupled to said differential output lines.

13. The method as set forth in claim 8, wherein said logic gate comprises a latch.

14. The circuit as set forth in claim 8, wherein said logic gate comprises a multiplexor.

15. A circuit comprising:
   at least one logic gate comprising an input line and an output line;
   a resistive element coupled to a biasing voltage; and
   a transistor, coupled in series to said resistive element, so as to provide an inductance between said output line and said resistive element.

16. The circuit as set forth in claim 15, wherein said logic gate comprises metal oxide semiconductor (MOS) transistors configured using current-mode logic.

17. The circuit as set forth in claim 16, wherein said transistor comprises a MOS transistor, wherein a gate of said MOS transistor is coupled to said resistive element, a drain of said MOS transistor is coupled to a power supply voltage, and a source of said MOS transistor is coupled to a differential output line.

18. The circuit as set forth in claim 15, wherein said logic gate comprises bipolar transistors configured using emitter-coupled logic.

19. The circuit as set forth in claim 18, wherein said transistor comprises a bipolar transistor, wherein a base of said bipolar transistors is coupled to said resistive element, a collector of said bipolar transistor is coupled to a power supply voltage, and an emitter of said bipolar transistor is coupled to said differential output line.

20. The circuit as set forth in claim 15, wherein said logic gate comprises a latch.

21. The circuit as set forth in claim 15, wherein said logic gate comprises a multiplexor.

22. A circuit comprising:
   at least one multi-stage logic gate comprising at least two differential inputs lines and at least two differential output lines, said multi-stage logic gate comprising more than a single logic stage;
   at least two resistive elements; and
   at least two inductive elements, each one of said inductive elements is coupled in series to one of said resistive elements and is coupled to one of said outputs such that said inductive elements couple said differential output lines to a power supply input.

23. The circuit as set forth in claim 22, wherein said multi-stage logic gate comprises a latch.

24. The circuit as set forth in claim 22, wherein said multi-stage logic gate comprises a multiplexor.

25. A circuit comprising:
   at least one multi-stage logic gate comprising an input line and an output line, said multi-stage logic gate comprising more than a single logic stage;
   a resistive element; and
   at least one inductive element, coupled to said resistive element and coupled to said output such that said inductive element couples said output line to a power supply input.

26. The circuit as set forth in claim 25, wherein said multi-stage logic gate comprises a latch.

27. The circuit as set forth in claim 25, wherein said multi-stage logic gate comprises a multiplexor.

28. A circuit comprising:
   at least one logic gate comprising at least two differential inputs lines and at least two differential output lines;
   at least two resistive elements, each of said resistive element is coupled to a biasing voltage; and
   at least two MOS transistors, each one of said transistors is coupled to one of said resistive elements and is coupled to one of said differential output lines such that said transistors couple said differential output lines to a power supply input, wherein a gate of each of said MOS transistors is coupled to one of said resistive elements, a drain of each of said MOS transistors is coupled to a power supply voltage, and a source of each of said MOS transistors is coupled to said differential output lines.

29. A circuit comprising:
   at least one logic gate comprising at least two differential inputs lines and at least two differential output lines;
   at least two resistive elements, each of said resistive element is coupled to a biasing voltage; and
   at least two bipolar transistors, each one of said transistors is coupled to one of said resistive elements and is coupled to one of said differential output lines such that said transistors couples said differential output lines to a power supply input, wherein a base of each of said bipolar transistors is coupled to one of said resistive elements, a collector of each of said bipolar transistors is coupled to a power supply voltage, and an emitter of each of said bipolar transistors is coupled to said differential output lines.

* * * * *